United States Patent
Altmannshofer et al.

(10) Patent No.: US 11,788,201 B2
(45) Date of Patent: Oct. 17, 2023

(54) METHOD FOR PRODUCING A SINGLE CRYSTAL FROM SEMICONDUCTOR MATERIAL BY THE FZ METHOD; DEVICE FOR CARRYING OUT THE METHOD AND SEMICONDUCTOR SILICON WAFER

(71) Applicant: SILTRONIC AG, Munich (DE)

(72) Inventors: Ludwig Altmannshofer, Lenggries (DE); Goetz Meisterernst, Mettenheim (DE); Gundars Ratnieks, Burghausen (DE); Simon Zitzelsberger, Neuoetting/Alzgern (DE)

(73) Assignee: Siltronic AG, Munich (DE)

( * ) Notice: Subject to any disclaimer, the term of this patent is extended or adjusted under 35 U.S.C. 154(b) by 483 days.

(21) Appl. No.: 17/256,138

(22) PCT Filed: Jun. 4, 2019

(86) PCT No.: PCT/EP2019/064554
§ 371 (c)(1),
(2) Date: Dec. 24, 2020

(87) PCT Pub. No.: WO2020/001940
PCT Pub. Date: Jan. 2, 2020

(65) Prior Publication Data
US 2021/0222319 A1 Jul. 22, 2021

(30) Foreign Application Priority Data
Jun. 25, 2018 (DE) .................. 10 2018 210 317.8

(51) Int. Cl.
*C30B 13/20* (2006.01)
*C30B 13/12* (2006.01)
(Continued)

(52) U.S. Cl.
CPC .............. *C30B 13/20* (2013.01); *C30B 13/12* (2013.01); *C30B 13/26* (2013.01); *C30B 29/06* (2013.01);
(Continued)

(58) Field of Classification Search
CPC ......... C30B 13/20; C30B 13/12; C30B 13/26; C30B 29/06; C30B 30/04
See application file for complete search history.

(56) References Cited

U.S. PATENT DOCUMENTS 3,203,768 A 8/1965 Tiller et al.
3,705,789 A 12/1972 Keller
(Continued)

FOREIGN PATENT DOCUMENTS

CN 105297131 A 2/2016
JP H11189486 A 7/1999
(Continued)

OTHER PUBLICATIONS

Y.X. Li et al., "Depth Profile of Thermal Donors in NTDCZSi", Phys. Stat. Sol. (c) 0, No. 2, 698-701 (2003).
(Continued)

*Primary Examiner* — Elizabeth E Mulvaney
(74) *Attorney, Agent, or Firm* — BROOKS KUSHMAN P.C.

(57) ABSTRACT

Single crystals of semiconductor material are produced by an FZ method, wherein a molten zone is created between a feed rod and a growing single crystal; the method involving melting feed rod material in a high frequency magnetic field of a first induction coil;
crystallizing material of the molten zone on top of the growing single crystal;
(Continued)

rotating the growing single crystal about an axis of rotation and changing the direction of rotation and the speed of rotation according to a predetermined pattern; and imposing an alternating magnetic field of a second induction coil on the molten zone, wherein the alternating magnetic field is not axisymmetric with respect to the axis of rotation of the growing single crystal.

12 Claims, 7 Drawing Sheets

(51) Int. Cl.
    *C30B 29/06*     (2006.01)
    *C30B 30/04*     (2006.01)
    *H01L 21/02*     (2006.01)
    *C30B 13/26*     (2006.01)

(52) U.S. Cl.
    CPC ........ *C30B 30/04* (2013.01); *H01L 21/02532* (2013.01); *H01L 21/02576* (2013.01); *H01L 21/02625* (2013.01)

(56) References Cited

U.S. PATENT DOCUMENTS

2006/0292890 A1     12/2006     Ammon et al.
2007/0193501 A1*     8/2007     Ono ........................ C30B 15/00
                                                                117/13

FOREIGN PATENT DOCUMENTS

| JP | 200044380 A | 2/2000 |
| JP | 2015218076 A | 12/2015 |
| JP | 2015229612 A | 12/2015 |
| KR | 1020060028447 A | 3/2006 |
| WO | 2008125104 A1 | 10/2008 |
| WO | 2014033212 A1 | 3/2014 |

OTHER PUBLICATIONS

G. Ratnieks et al., "Influence of the three dimensionality of the HF electromagnetic field on resistivity variations in Si single crystals during FZ growth", Journal of Crystal Growth 216 (2000) 204-219.

G. Robertson et al., "Magnetic Field Effects on Float-Zone Si Crystal Growth," 2300 Journal of Crystal Growth 76 Jul. 1986, No. 1.

* cited by examiner

METHOD FOR PRODUCING A SINGLE CRYSTAL FROM SEMICONDUCTOR MATERIAL BY THE FZ METHOD; DEVICE FOR CARRYING OUT THE METHOD AND SEMICONDUCTOR SILICON WAFER

CROSS REFERENCE TO RELATED APPLICATIONS

This application is the U.S. National Phase of PCT Appln. No. PCT/EP2019/064554 filed Jun. 4, 2019, which claims priority to German Application No. 10 2018 210 317.8 filed Jun. 25, 2018, the disclosures of which are incorporated in their entirety by reference herein.

BACKGROUND OF THE INVENTION

Field of the Invention

The object of the invention is a process for producing a single crystal of semiconductor material according to the FZ method, comprising creating a melting zone between a feed rod and a growing single crystal. The invention also concerns a device suitable for carrying out the process and a silicon semiconductor wafer doped with n-type dopant which becomes accessible by the process.

Description of the Related Art

The floating zone method comprises creating a molten zone between a feed rod and a growing single crystal, melting material of the feed rod in a high frequency magnetic field, and crystallizing material of the molten zone on top of the growing single crystal.

U.S. Pat. No. 3,705,789 describes the fabrication of a single crystal using the FZ method with an additional magnetic field impressed on the molten zone. This magnetic field is generated by a further induction coil, which is fed with electric current of a frequency between 500 Hz and 500 kHz. The additionally impressed magnetic field serves to support the melting zone.

WO2008/125104 A1 describes a similar process, the main purpose of which is to homogenize the electrical properties of the single crystal on a wafer cut from the single crystal. The method also includes rotating the growing single crystal about an axis of rotation and changing the direction of rotation and speed of rotation according to a predetermined pattern.

JP 2015-229 612 A describes a process according to the FZ method which makes accessible a single crystal silicon semiconductor wafer having a diameter of 200 mm and an RRV which, taking into account an edge exclusion of 5 mm, is in the best case between 3.8% and 16%. RRV (radial resistivity variation) is a measure of resistivity variation in a plane perpendicular to the longitudinal axis of the single crystal. The RRV is calculated according to the formula below, where $\rho_{max}$ and $\rho_{min}$ denote the highest and lowest resistivity, respectively, in the plane of the wafer: RRV= $[(\rho_{max}-\rho_{min})/\rho_{min}]\times 100\%$ Due to, among other things, the comparatively small segregation coefficients of n-type dopants such as phosphorus, arsenic and antimony, it is more difficult to achieve a homogenous distribution of such a dopant in the growing single crystal. Therefore, the resistivity of n-doped silicon wafers varies more in the radial direction than that of corresponding wafers doped with p-type dopants.

The purpose of this invention is to provide a process for producing a single crystal of semiconductor material according to the FZ method, which effects a homogenization of the resistivity and makes a semiconductor wafer of single crystal silicon with improved electrical properties accessible.

SUMMARY OF THE INVENTION

The invention is directed to a process for producing a single crystal of semiconductor material doped with dopant, comprising creating a molten zone between a feed rod and a single growing crystal; melting material of the feed rod in a high frequency magnetic field of a first induction coil;

crystallizing material of the molten zone on top of the growing single crystal;

rotating the growing single crystal about an axis of rotation; and changing the direction of rotation and the speed of rotation according to a predetermined pattern; and imposing an alternating magnetic field of a second induction coil on the molten zone, wherein the alternating magnetic field is not axisymmetric with respect to the axis of rotation of the growing single crystal.

DETAILED DESCRIPTION OF THE PREFERRED EMBODIMENTS

Figure 1:
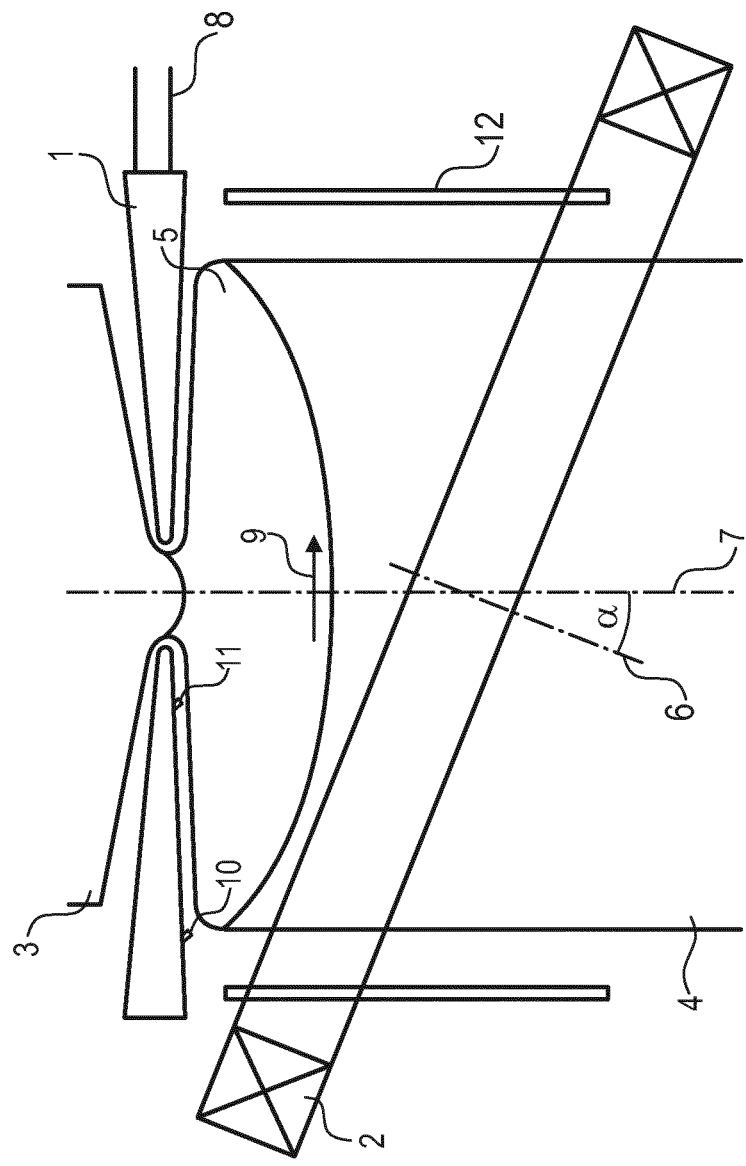
FIG. 1 shows schematically the characteristics of a preferred design of the device according to the invention.

The inventors have found that it is advantageous to arrange the second induction coil, which imposes the alternating magnetic field on the molten zone, tilted from a horizontal position in order to solve the task. The axis through the center of the second induction coil and the axis of rotation of the growing single crystal include an angle different from zero. This angle is preferably not less than 15° and not more than 30°. The alternating magnetic field exerts an electromagnetic force on the molten zone, which improves the mixing of dopant in the molten zone and aligns the flow in the center of the molten zone markedly asymmetrically. This ensures that the dopant is more uniformly incorporated, especially in the center of the growing single crystal.

The process is effective independent of the dopant type. It can therefore be used to produce single crystals of semiconductor material doped with n-type dopant as well as those doped with p-type dopant. It is particularly advantageous to use the process to produce silicon single crystals, especially those with a diameter of at least 200 mm. In this case, the feed rod preferably consists of polycrystalline silicon and is preferably produced by chemical vapor deposition.

Dopant can be supplied to the growing single crystal via a pre-doped feed rod and/or via doping gas which is conducted to the melting zone. According to a preferred design of the invention, dopant is conducted as doping gas on a path to an outer area of the molten zone. It is particularly preferred to conduct doping gas in two different ways to an outer area of the molten zone and to an inner area of the molten zone. The flow of the doping gas and/or the concentration of dopant in the doping gas can be adjusted individually for both ways and by this means, a depletion of dopant at the edge of the growing single crystal can be counteracted. It is advantageous that the doping gas is not conducted to the outer area of the molten zone until the growing single crystal has reached a diameter at least large enough for the doping gas from the nozzle positioned on the outside to meet the free surface of the melt and not directly the edge of the crystal. In a preferred configuration, the position of the nozzle corresponds to 90% to 95% of the diameter of the cylindrical portion of crystal and doping begins when reaching between 95% and 100% of the diameter of the cylindrical portion. The cylindrical portion is the portion of the single crystal that is divided into semiconductor wafers during subsequent processing. If this minimum diameter has not yet been reached, the flow of the doping gas temporarily meets the phase boundary between the molten zone and the growing single crystal at the edge of the growing single crystal, which is particularly susceptible to disturbances, including those resulting from the conduction of doping gas to this point. The doping gas preferably consists of a carrier gas and the dopant, for example argon and phosphine.

The growing single crystal is rotated clockwise or counterclockwise about an axis of rotation and the direction and speed of rotation is changed from time to time according to a predetermined pattern.

An object of the invention is further a device for producing a single crystal of semiconductor material doped with dopant, comprising
  a first induction coil for creating a molten zone between a feed rod and a growing single crystal;
  current leads to the first induction coil; and
  a second induction coil surrounding said growing single crystal and imposing an alternating magnetic field on said melting zone, said second induction coil being tilted from a horizontal plane.

The second induction coil is supplied with alternating current whose frequency is preferably not less than 25 Hz and not more than 250 Hz. This frequency is thus significantly lower than the frequency of the alternating current in the first induction coil, which is in the MHz range, typically in the range from 2 to 3 MHz. The second induction coil is preferably operated with a magnetomotive force (mmf) of not less than 700 ampere-turns and not more than 1100 ampere-turns.

The second induction coil is tilted from a horizontal plane. The axis through the center of this induction coil encloses an angle with the axis of rotation of the growing single crystal that is preferably not less than 15° and not more than 30°. The second induction coil is preferably tilted so that the distance to the first induction coil above is greatest at the point where the first induction coil has its current leads. In other words, the second induction coil is preferably tilted away from the current leads of the first induction coil.

Preferably the device further comprises one or more nozzles for conducting doping gas to an outer portion of the molten zone and more preferably one or more further nozzles for conducting doping gas to an inner portion of the molten zone. The nozzles are preferably mounted on a lower side of the first induction coil. For example, there are three of the outer nozzles and the distance between one of these nozzles and the next is 90° or preferably 120°.

In addition, the device preferably comprises a reheater which surrounds the growing single crystal in the area of the phase boundary between the melting zone and the growing single crystal. The reheater is preferably designed as a reflector, but can also be designed as an active heating element. The reheater preferably has such a diameter that its distance to the growing single crystal is smaller than the distance of the second induction coil to the growing single crystal.

The second induction coil is preferably housed in a housing in which electrically insulated windings of the second induction coil are cooled by a coolant such as water. The housing is preferably made of an electrically conductive material, such as non-magnetic (non-ferromagnetic) steel. It is particularly preferred to make the housing particularly electrically conductive by means of a coating, preferably a silver coating. The coating has a thickness that is preferably not less than 40 μm.

Finally, the invention concerns a semiconductor wafer of monocrystalline silicon with a diameter of at least 200 mm doped with an n-type dopant comprising
  an interstitial oxygen concentration of not more than $1 \times 10^{16}$ atoms/cm$^3$;
  an increase in resistivity from a position R/2 to the edge of the semiconductor wafer of at least 2%, wherein R denotes the radius of the semiconductor wafer;
  a variation in resistivity expressed as RRV of not more than 9%; and
  striations with a fluctuation range of not more than ±10%.

The n-type dopant is preferably phosphorus. A semiconductor wafer according to the invention is cut from a single crystal produced by the application of the process according to the invention.

The concentration of interstitial oxygen is measured in accordance with the new ASTM standard.

In contrast to semiconductor wafers doped by NTD (neutron transmutation doping), the resistivity of a wafer according to the invention increases towards the edge.

The RRV is measured according to the 4-point probes method along the diameter of the semiconductor wafer with a distance of 2 mm between adjacent measuring positions, whereby a 6 mm edge exclusion must be taken into account.

Striations are caused by temperature and dopant concentration fluctuations at the phase boundary between the molten zone and the growing single crystal and show the resulting fluctuations of the resistivity. The investigation of the fluctuation range of striations is carried out by means of SRP measurement (spreading resistance profiling) along a line leading radially outwards from the center of the semiconductor wafer with a distance between adjacent measuring positions of 50 μm, whereby a length of 60% of the radius is measured.

The characteristics given with regard to the above mentioned versions of the inventive method can be transferred to the inventive device accordingly. Conversely, the characteristics given in respect of the above forms of the device conforming to the invention may be applied mutatis mutandis to the process conforming to the invention. These and other characteristics of the inventive forms are explained in the description of the figure and in the claims. The individual features may be realized either separately or in combination as embodiments of the invention. Furthermore, they can describe advantageous executions which can be protected independently.

The invention is described in more detail below with reference to drawings.

The device shown in FIG. 1 comprises a first induction coil 1 and a second induction coil 2. The first induction coil is powered by high frequency alternating current and is located between a feed rod 3 and a growing single crystal 4. The main task of the first induction coil is to create a melt zone 5 between the feed rod 3 and the growing single crystal 4 and to melt material from the feed rod 3 to compensate for the material from the melting zone 5 that crystallizes on the growing single crystal 4. Not shown are devices known to the expert for rotating the feed rod and the growing single crystal and for lowering the growing single crystal.

The second induction coil 2 is operated with low-frequency alternating current and is arranged around the growing single crystal 4 in such a way that it is tilted from a horizontal position. Due to this arrangement, an axis 6 through the center of the second induction coil 2 and the axis of rotation 7 of the growing single crystal 4 intersect at an angle α that has a value greater than zero. The second induction coil 2 is tilted away from current leads 8 to the first induction coil 1 and imposes an alternating magnetic field on the melting zone 5. Due to the tilted arrangement of the second induction coil 2, the alternating magnetic field in the molten zone 5 causes a volume force that drives a melt flow in the direction of the arrow 9 across the center of the molten zone 5. This asymmetrical melt flow homogenizes the distribution of dopant in the molten zone, which ultimately results in a homogenization of the distribution of dopant in the growing single crystal 4.

The apparatus shown further comprises at least one nozzle 10 for conducting doping gas containing the dopant to an outer portion of the melting zone 5 and at least one further nozzle 11 for conducting doping gas containing the dopant to an inner portion of the melting zone 5. The nozzles 10, 11 are preferably mounted on the lower side of the first induction coil 1. A typical inventive device can also do without the internal nozzles 11.

Finally, the device shown comprises a passive reheater 12 (reflector) which surrounds the growing single crystal 4 and causes the radial temperature gradient at the edge of the growing single crystal 4 to be attenuated, in particular in the region of the phase boundary between the melting zone 5 and the growing single crystal 4.

LIST OF REFERENCE SIGNS USED 1 first induction coil
2 second induction coil
3 feed rod
4 growing single crystal
5 molten zone
6 axis
7 rotation axis
8 current leads
9 direction of arrow
10 nozzle
11 nozzle
12 reheater

DETAILED DESCRIPTION OF EXAMPLES OF EXECUTION IN ACCORDANCE WITH THE INVENTION

The invention was tested in experiments using a device with the characteristics shown in FIG. 1 to produce silicon single crystals doped with n-type dopant (doping gas: Ar and $PH_3$). The single crystals were then ground and processed into polished semiconductor wafers with diameters of 200 mm. The second induction coil 2 had a diameter of 300 mm and consisted of 121 windings. It was arranged tilted downwards from a horizontal position of current leads 8 of the first induction coil 1, where the angle α between axis 6 through the center of the second induction coil 2 and axis 7 of rotation of the growing single crystal was 22.5°. The second induction coil was operated at 50 Hz alternating current, and the current intensity was 5 A in a first example experiment (corresponding to mmf of 605 ampere-turns) and 7.5 A in a second example experiment (corresponding to mmf of 907.5 ampere-turns). For comparison purposes, another single crystal was produced in a comparative experiment and processed into semiconductor wafers, the single crystal this time was produced by a device with the characteristics like in FIG. 1 but without the second induction coil 2.

The resistivity of the wafers obtained was measured by the 4-point probe method along the diameter of the wafer (distance between adjacent measuring positions 2 mm, edge exclusion 6 mm), and the fluctuation range of striations was determined by SRP measurement (along a line leading radially outwards from the center of the wafer with a distance between adjacent measuring positions of 50 μm, over a length of 60% of the radius).

Figure 2:
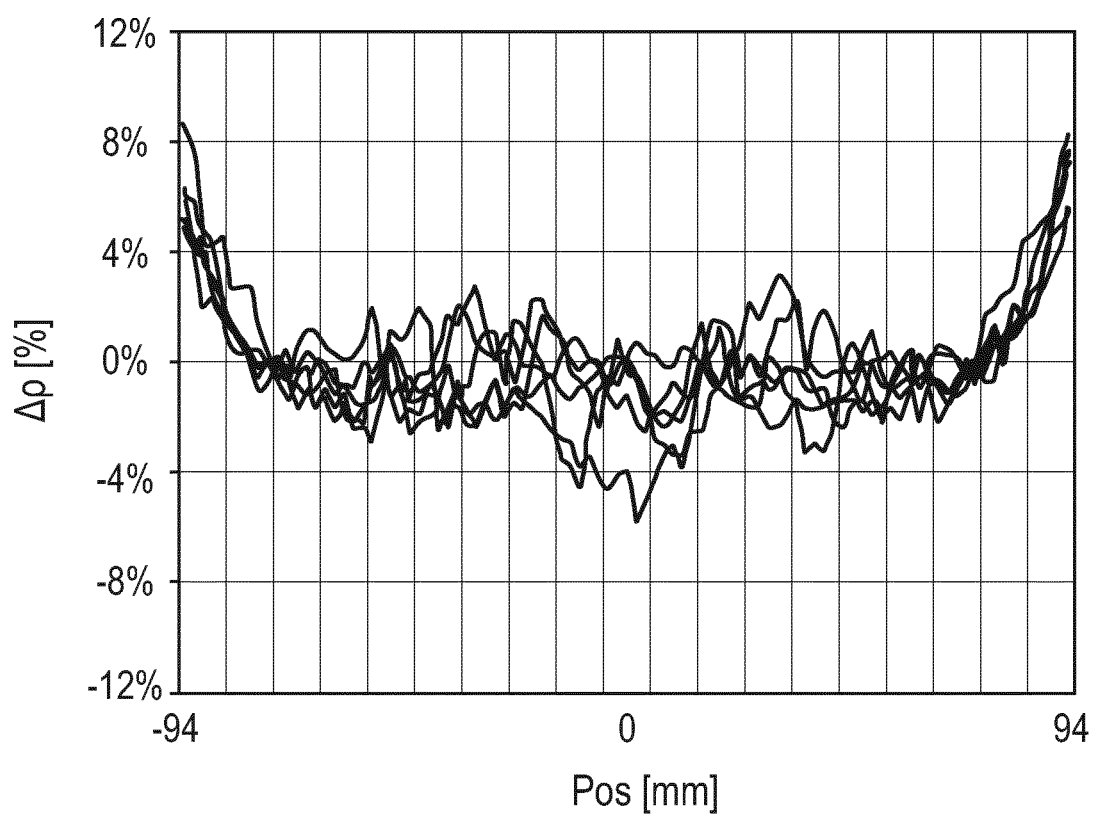
FIG. 2, FIG. 3, FIG. 4 and FIG. 6 show for some semiconductor wafers from example experiments and a comparison experiment the deviation of the resistivity $\Delta\rho$ measured by the 4-point probes method from a target resistivity depending on the radial coordinate Pos.

FIG. 2 shows for some wafers of the first example experiment the deviation of the resistivity Δρ from a target resistivity depending on the radial coordinate Pos.

Figure 3:
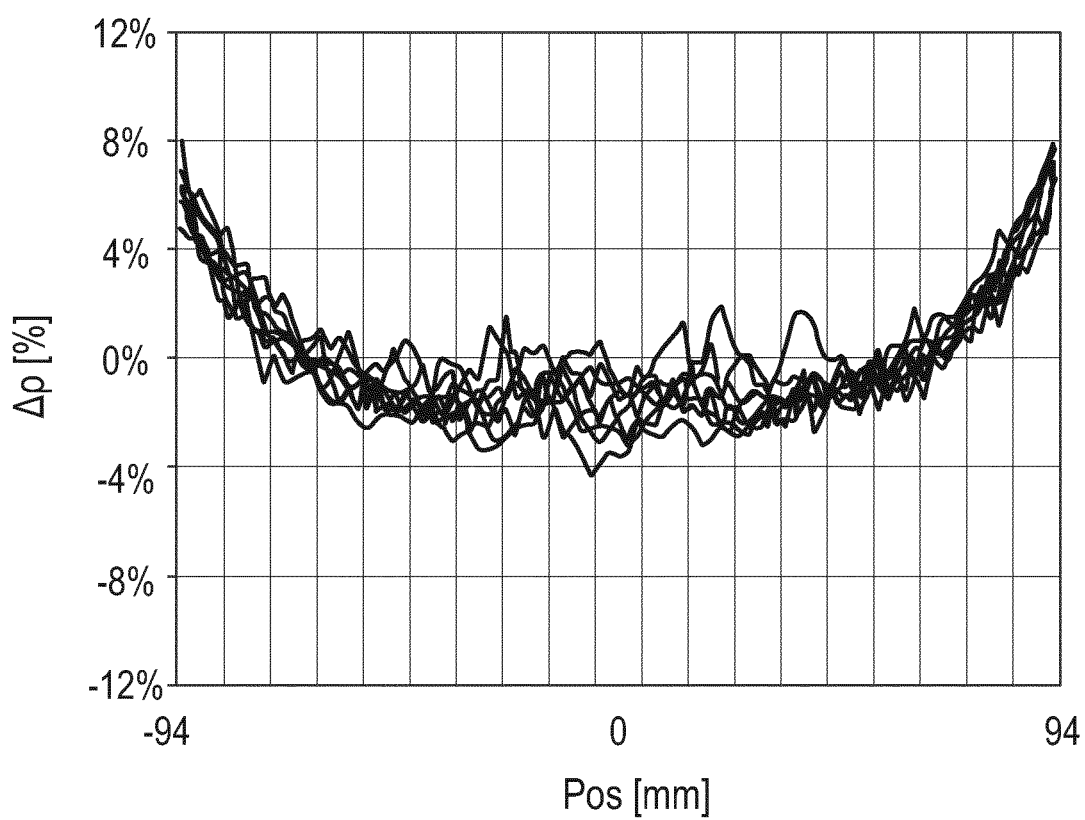

FIG. 3 shows the deviation of the resistivity Δρ from a target resistivity as a function of the radial coordinate Pos for some semiconductor wafers of the second example experiment. It can be seen that using a higher current intensity a more uniform resistivity curve could be achieved especially in the area around the center (Pos=0 mm) of the semiconductor wafers.

Figure 4:
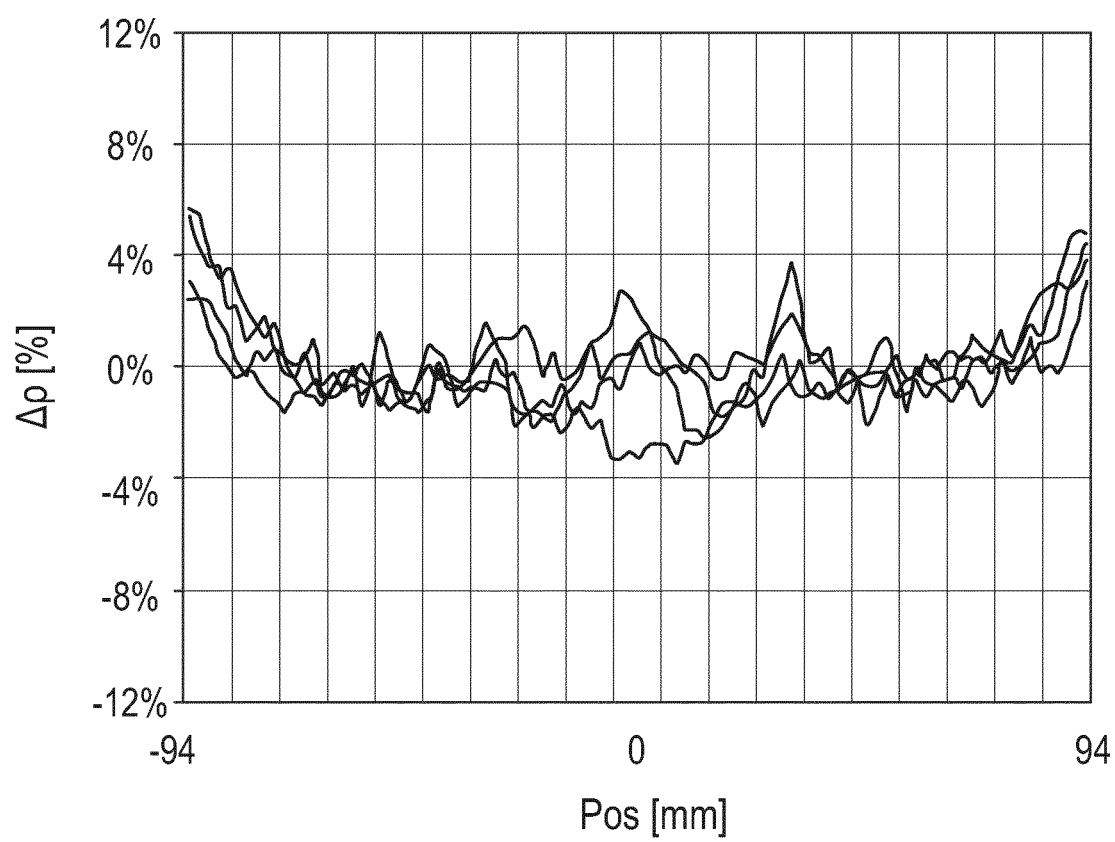

FIG. 4 shows the deviation of the resistivity Δρ from a target resistivity as a function of the radial coordinate Pos for some semiconductor wafers in a third example experiment. In the third example experiment, the doping of the single crystal takes place by conducting doping gas to the molten zone on a path to an outer portion of the molten zone and on a path to an inner portion of the molten zone, while in the first and second example experiment the doping gas was not conducted to the outer portion of the molten zone. It can be seen that by additionally conducting the doping gas to the outer portion of the molten zone, a more even resistivity curve could be achieved, especially in the area of the edge (Pos=±94 mm) of the semiconductor wafers. For these semiconductor wafers, the RRV was not more than 9% and the fluctuation range of striations was not more than ±10%.

Figure 5:
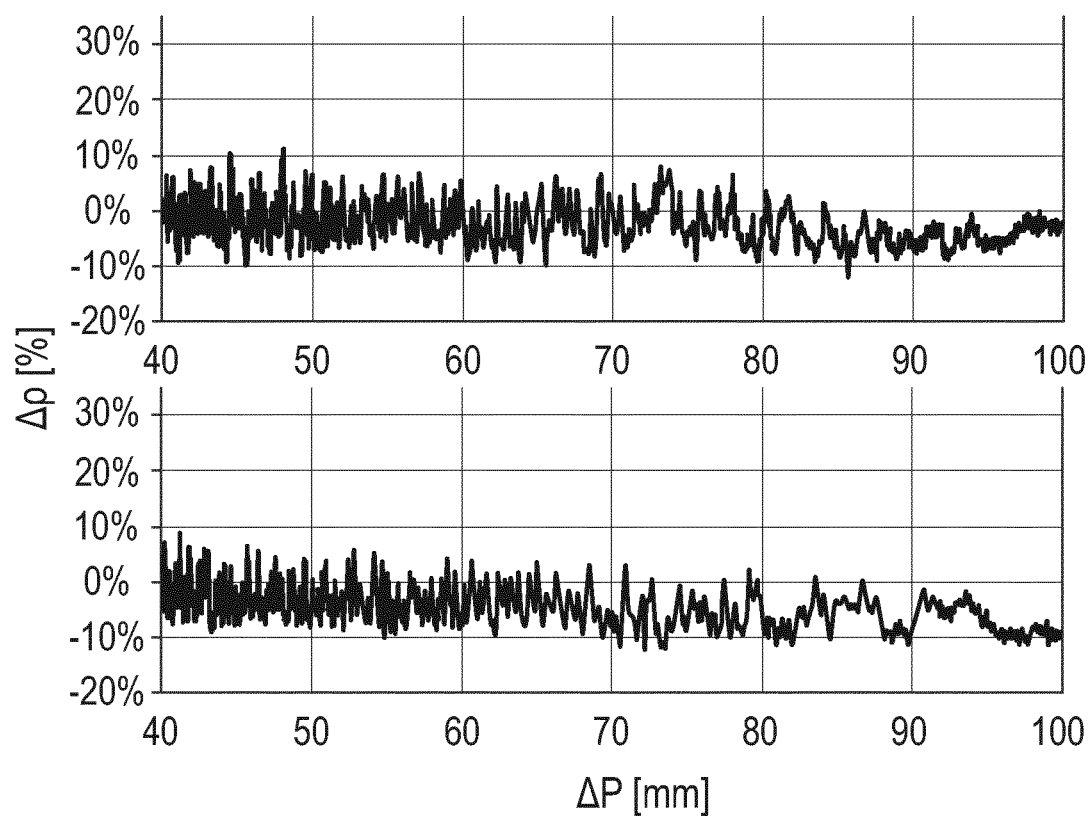
FIG. 5 and FIG. 7 show for semiconductor wafers of an example experiment and semiconductor wafers of a comparison experiment the deviation of the resistivity $\Delta\rho$ measured by SRP measurement from a target resistivity as a function of a distance $\Delta P$ from the edge of these semiconductor wafers.

FIG. 5 shows the result of SRP measurements on semiconductor wafers of the third example experiment, where the deviation of the resistivity Δρ from a target resistivity is plotted as a function of a distance ΔP from the edge of two of these semiconductor wafers. ΔP=100 mm is the center of the wafer.

Figure 6:
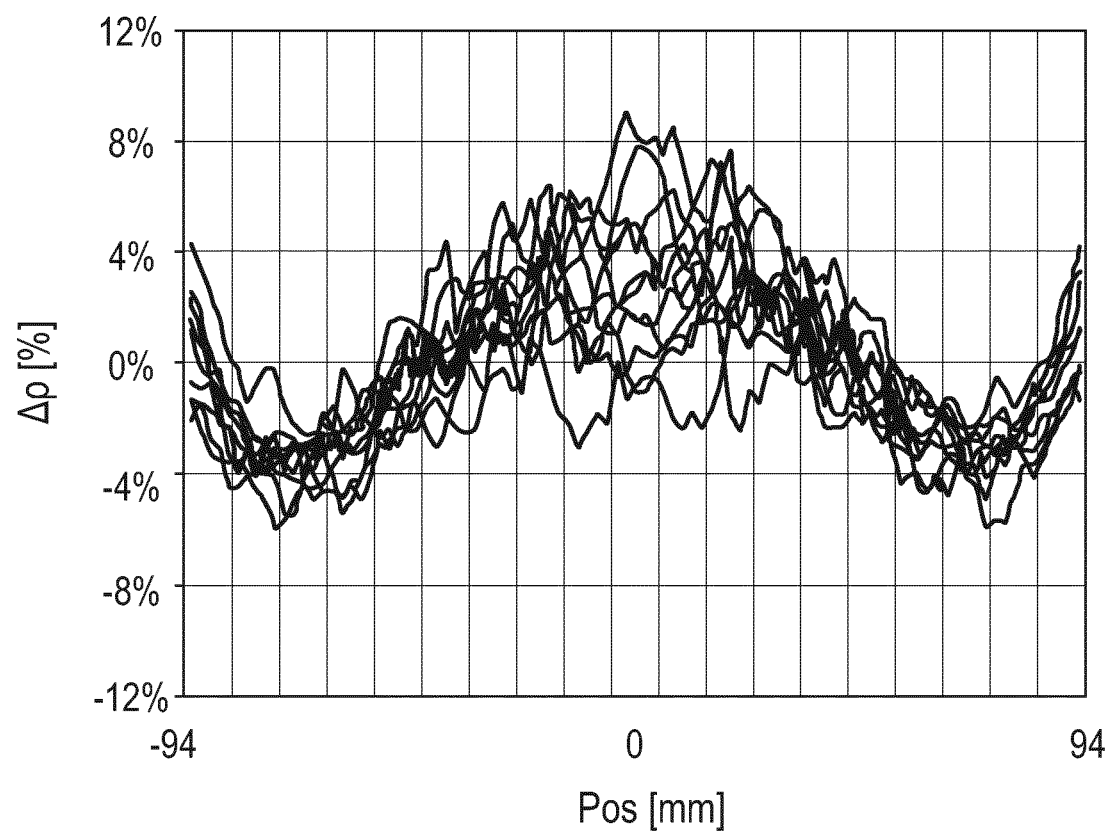

FIG. 6 shows for some semiconductor wafers of the comparison experiment the deviation of the resistivity Δρ from a target resistivity as a function of the radial coordinate Pos.

Figure 7:
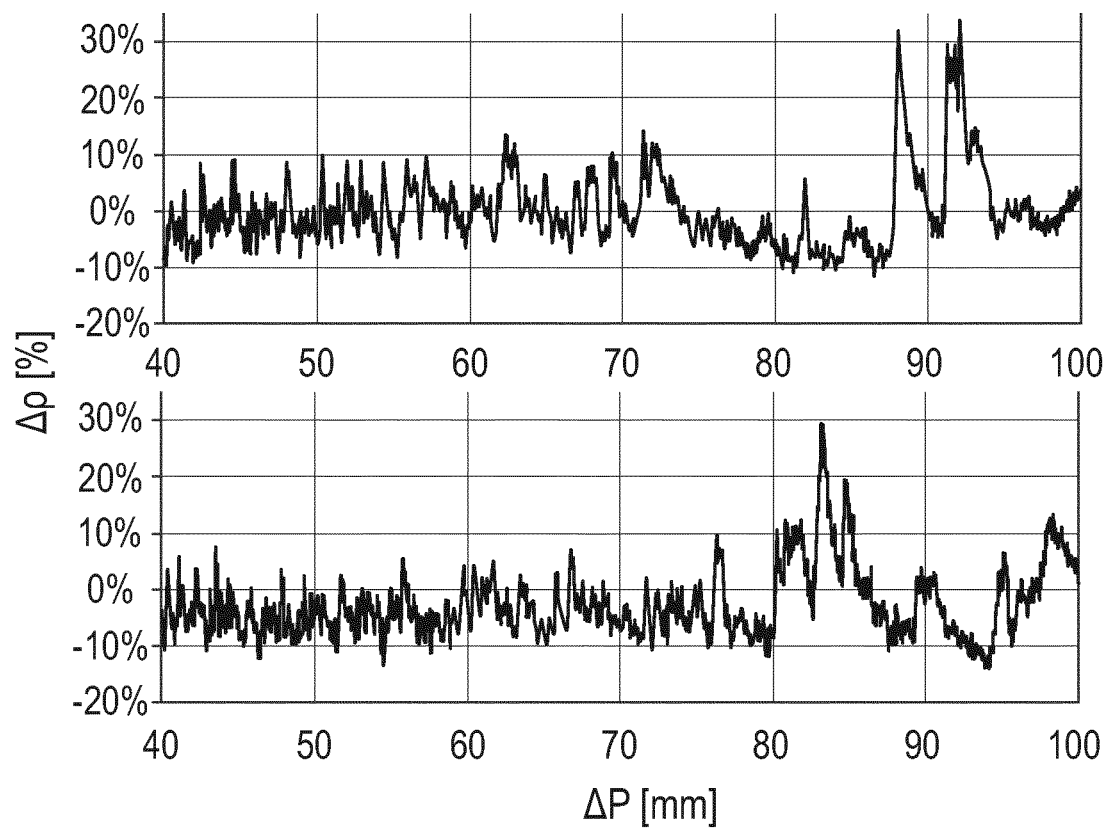

FIG. 7 shows the result of SRP measurements on semiconductor wafers of the comparison experiment, where the deviation of the resistivity Δρ from a target resistivity is plotted as a function of a distance ΔP from the edge of two of these semiconductor wafers. ΔP=100 mm is the center of the wafer.

The above description of exemplary designs is to be understood as an example. On the one hand, this disclosure enables the expert to understand the invention at hand and the associated advantages, and on the other hand, the expert's understanding also includes obvious modifications and modifications of the structures and processes described. Therefore, all such modifications and modifications as well as equivalents should be covered by the scope of protection of the claims.

The invention claimed is:

1. A method for producing a single crystal of semiconductor material doped with dopant, comprising:
    creating a molten zone between a feed rod and a growing single crystal;
    melting material of the feed rod in a high frequency magnetic field of a first induction coil;
    crystallizing material of the molten zone on top of the growing single crystal;
    rotating the growing single crystal about an axis of rotation and changing the direction of rotation and the speed of rotation according to a predetermined pattern; and
    imposing an alternating magnetic field of a second induction coil on the molten zone, wherein the alternating magnetic field is not axisymmetric with respect to the axis of rotation of the growing single crystal.

2. The method of claim 1, wherein an axis through the center of the second induction coil and the axis of rotation of the growing single crystal include an angle which is not less than 15° and not more than 30°.

3. The method of claim 1, wherein the second induction coil is operated with a magnetomotive force of not less than 700 ampere-turns and not more than 1100 ampere-turns.

4. The method of claim 1, further comprising conducting a doping gas containing the dopant to the molten zone in a path to an outer portion of the molten zone.

5. The method of claim 4, wherein conducting the doping gas to the molten zone on the way to the outer portion of the molten zone is started after the growing single crystal has reached a diameter corresponding to at least 95% of the diameter of a cylindrical portion of the growing single crystal and before the diameter is 100% of the diameter of the cylindrical portion.

6. A device for producing a single crystal of semiconductor material doped with dopant, comprising:
    a first induction coil for creating a molten zone between a feed rod and a growing single crystal;
    current leads to the first induction coil; and
    a second induction coil surrounding the growing single crystal and imposing an alternating magnetic field on said molten zone, said second induction coil being tilted from a horizontal plane.

7. The device of claim 6, wherein an axis through the center of the second induction coil includes an angle with an axis of rotation of the growing single crystal that is not less than 15° and not more than 30°.

8. The device of claim 6, wherein the distance between the first and second induction coils is greatest where the first induction coil has its current leads.

9. The device of claim 5, further comprising at least one nozzle for conducting doping gas containing the dopant to an outer portion of the molten zone.

10. The device of claim 9, comprising three nozzles spaced 120° from each other for conducting the doping gas to the outer portion of the molten zone.

11. The device of claim 6, further comprising a reheater surrounding the growing single crystal in the region of a phase boundary between the molten zone and the growing single crystal.

12. A semiconductor wafer of single crystal silicon having a diameter 2R of at least 200 mm having an edge and doped with an n-type dopant, and comprising
    an interstitial oxygen concentration of not more than $1 \times 10^{16}$ atoms/cm$^3$;
    an increase in resistivity from a position R/2 to the edge of the semiconductor wafer of at least 2%, wherein R denotes the radius of the semiconductor wafer;
    a variation in resistivity expressed as RRV of not more than 9%; and
    striations with a fluctuation range of not more than ±10%.

* * * * *